(12) United States Patent
Zhang et al.

(10) Patent No.: US 9,899,225 B2
(45) Date of Patent: Feb. 20, 2018

(54) METHOD FOR MANUFACTURING ARRAY SUBSTRATE, ARRAY SUBSTRATE AND MASK

(71) Applicants: BOE Technology Group Co., Ltd., Beijing (CN); Beijing BOE Display Technology Co., Ltd., Beijing (CN)

(72) Inventors: Zhichao Zhang, Beijing (CN); Tsung-Chieh Kuo, Beijing (CN); Zheng Liu, Beijing (CN); Xiaoxiang Zhang, Beijing (CN); Xi Chen, Beijing (CN); Mingxuan Liu, Beijing (CN)

(73) Assignees: BOE TECHNOLOGY GROUP CO., LTD., Beijing (CN); BEIJING BOE DISPLAY TECHNOLOGY CO. LTD., Beijing (CN)

( * ) Notice: Subject to any disclaimer, the term of this patent is extended or adjusted under 35 U.S.C. 154(b) by 0 days.

(21) Appl. No.: 15/105,175

(22) PCT Filed: Sep. 10, 2015

(86) PCT No.: PCT/CN2015/089363
§ 371 (c)(1),
(2) Date: Jun. 16, 2016

(87) PCT Pub. No.: WO2016/183968
PCT Pub. Date: Nov. 24, 2016

(65) Prior Publication Data
US 2017/0125250 A1    May 4, 2017

(30) Foreign Application Priority Data
May 18, 2015    (CN) .......................... 2015 1 0253297

(51) Int. Cl.
*H01L 21/84*         (2006.01)
*H01L 21/28*         (2006.01)
(Continued)

(52) U.S. Cl.
CPC .... *H01L 21/28008* (2013.01); *H01L 27/1288* (2013.01); *H01L 29/66742* (2013.01);
(Continued)

(58) Field of Classification Search
CPC ........... H01L 27/1288; H01L 21/32139; H01L 29/4908
See application file for complete search history.

(56) References Cited

U.S. PATENT DOCUMENTS 9,329,445 B2    5/2016   Xu
2010/0273283 A1*  10/2010  Chang ................... G03F 7/0005
                                                      438/34
(Continued)

FOREIGN PATENT DOCUMENTS

CN    101442028 A    5/2009
CN    101598894 A    12/2009
(Continued)

OTHER PUBLICATIONS

International Search Report and Written Opinion for International Application No. PCT/CN2015/089363, dated Feb. 17, 2016, 9 pages.
(Continued)

*Primary Examiner* — Selim Ahmed
*Assistant Examiner* — Evan Clinton
(74) *Attorney, Agent, or Firm* — Westman, Champlin & Koehler, P.A.

(57) ABSTRACT

An embodiment of present disclosure provides a method for manufacturing an array substrate, an array substrate manufactured by the method, and a mask. The method for manufacturing the array substrate includes: providing a mask including a transparent substrate, a light semi-transmission region, a light non-transmission region, and a light transmission region excluding the light semi-transmission
(Continued)

region and the light non-transmission region being formed on the transparent substrate; forming a first mask pattern on a base substrate by means of the light non-transmission region of the mask; and forming a second mask pattern on the base substrate having the first mask pattern by means of the light semi-transmission region and the light non-transmission region of the mask.

14 Claims, 10 Drawing Sheets

(51) Int. Cl.
  *H01L 27/12* (2006.01)
  *H01L 29/66* (2006.01)
  *G02F 1/1368* (2006.01)
  *G02F 1/1362* (2006.01)
(52) U.S. Cl.
  CPC .. *G02F 1/1368* (2013.01); *G02F 2001/13685* (2013.01); *G02F 2001/136236* (2013.01)

(56) References Cited

U.S. PATENT DOCUMENTS

| | | | |
|---|---|---|---|
| 2012/0094416 | A1 | 4/2012 | Tanaka et al. |
| 2017/0199466 | A1* | 7/2017 | Xue ................. G03F 7/70058 |

FOREIGN PATENT DOCUMENTS

| | | |
|---|---|---|
| CN | 103592815 A | 2/2014 |
| CN | 104062794 A | 9/2014 |
| CN | 104810322 A | 7/2015 |

OTHER PUBLICATIONS

English translation of Box No. V of the Written Opinion of the International Searching Authority for International Application No. PCT/CN2015/089363, dated Feb. 17, 2016, 2 pages.
First Office Action, including Search Report, for Chinese Patent Application No. 201510253297.7, dated Apr. 20, 2017, 13 pages.
Office Action for Chinese Patent Application No. 201510253297.7, dated Dec. 27, 2017, 14 pages.

* cited by examiner

METHOD FOR MANUFACTURING ARRAY SUBSTRATE, ARRAY SUBSTRATE AND MASK

BACKGROUND OF THE INVENTION

Field of the Invention

The present disclosure relates to a display technical filed, more particularly, relates to a method for manufacturing an array substrate, an array substrate manufactured by the method, and a mask.

Description of the Related Art

Thin film transistor liquid crystal display (TFT-LCD) is one type of various liquid crystal displays. In a photolithography process of the TFT-LCD, it is required to use a mask to produce a pattern.

The principle of patterning an array substrate of the TFT-LCD by means of masks is that: coating firstly a photoresist on an base substrate; next, illuminating a mask with a light source and illuminating the photoresist on the base substrate with a light transmitted through the mask; then solidifying the unilluminated photoresist by developing (dissolving the illuminated photoresist by a chemical reaction); and finally, forming a desired pattern on the base substrate by etching.

In the prior art, the pattern on each of the masks is constant, that's to say, each of the masks corresponds to an unique pattern. Since a plurality of patterns are required to be formed sequentially on the base substrate during manufacturing of the array substrate, a plurality of masks are required to be purchased so as to make them correspond to the desired patterns respectively, and price of the mask are relatively high, the manufacturing process of the array substrate is thus relatively complicated and the cost is relatively high.

SUMMARY OF THE INVENTION

In order to solve the problem of complicated manufacturing process and high cost of the array substrate, the present disclosure provides a method for manufacturing an array substrate, an array substrate manufactured by the method, a display panel including this kind of array substrate and a mask.

In a first aspect, there is provided a method for manufacturing an array substrate, the method comprising:

providing a mask including a transparent substrate, a light semi-transmission region, a light non-transmission region, and a light transmission region excluding the light semi-transmission region and the light non-transmission region being formed on the transparent substrate, forming a first mask pattern on an base substrate by means of the light non-transmission region of the mask; and forming a second mask pattern on the base substrate having the first mask pattern by means of the light semi-transmission region and the light non-transmission region of the mask.

Optionally, the step of forming the first mask pattern on the base substrate by means of the light non-transmission region of the mask comprising:

forming a first film layer on the base substrate having a source/drain electrode pattern of metal;

coating the first film layer formed on the base substrate with a negative photoresist;

aligning the light non-transmission region of the mask with the source/drain electrode pattern of metal, and exposing the base substrate coated with the negative photoresist to intensive light;

developing and etching the base substrate after exposure so as to obtain the first mask pattern; and stripping off the negative photoresist.

Optionally, the step of forming a second mask pattern on the base substrate having the first mask pattern by means of the light semi-transmission region and the light non-transmission region of the mask comprising:

forming a second film layer on the base substrate having the first mask pattern;

coating a positive photoresist on the second film layer formed on the base substrate;

aligning the light semi-transmission region and the light non-transmission region of the mask with an area around the source/drain electrode pattern of metal and the source/drain electrode pattern of metal, respectively, and exposing the base substrate coated with the positive photoresist to weak light;

developing and etching the base substrate after exposure so as to obtain the second mask pattern; and stripping off the positive photoresist.

Optionally, the first mask pattern is a via-hole pattern

Optionally, the first film layer is a passivation layer film.

Optionally, the second film layer is an Indium-Tin Oxide film.

Optionally, the light non-transmission region is located within the light semi-transmission region.

Optionally, the shape of the light non-transmission region may be any one of a rectangle, a square, a triangle and a circle.

Optionally, the shape of the boundary of the light semi-transmission region may be any one of a rectangle, a square, a triangle and a circle.

In a second aspect, there is provided an array substrate which is manufactured by the method of any one of the first aspect.

In a third aspect, there is provided a display panel comprising the array substrate of the second aspect.

In a fourth aspect, there is provided a mask, wherein, the mask comprising:

a transparent substrate, a light semi-transmission region, a light non-transmission region formed on the light semi-transmission region, and a light transmission region excluding the light semi-transmission region and the light non-transmission region being formed on the transparent substrate;

wherein, the light non-transmission region serves to form a first mask pattern of an array substrate, and the light semi-transmission region and the light non-transmission region serve to form a second mask pattern of the array substrate together.

Optionally, the mask further comprises a light semi-transmission film formed on the transparent substrate, and the light semi-transmission region is formed on the light semi-transmission film.

Optionally, the first mask pattern is a via-hole pattern.

Optionally, the shape of the light non-transmission region may be any one of a rectangle, a square, a triangle and a circle.

Optionally, the shape of the boundary of the light semi-transmission region may be any one of a rectangle, a square, a triangle and a circle.

The present disclosure provides a method for manufacturing an array substrate and the array substrate, and a mask, wherein, firstly, forming the first mask pattern on the base substrate by means of the light non-transmission region of the mask; and then forming a second mask pattern on the base substrate having the first mask pattern by means of the light semi-transmission region and the light non-transmission region of the same mask. Compared with the current method for manufacturing the array substrate, it simplifies the manufacturing process of the array substrate and reduces the manufacturing cost.

It should be appreciated that the above-mentioned description and the following description are only illustrative and exemplary, and should not be construed as being limited to the present invention.

BRIEF DESCRIPTION OF THE DRAWINGS

In order to illustrate the object, technical solution and advantages of the present disclosure more clearly, the embodiments of the present disclosure will be further described in detail hereinafter with reference to the accompanying drawings, in which.

Figure 1:
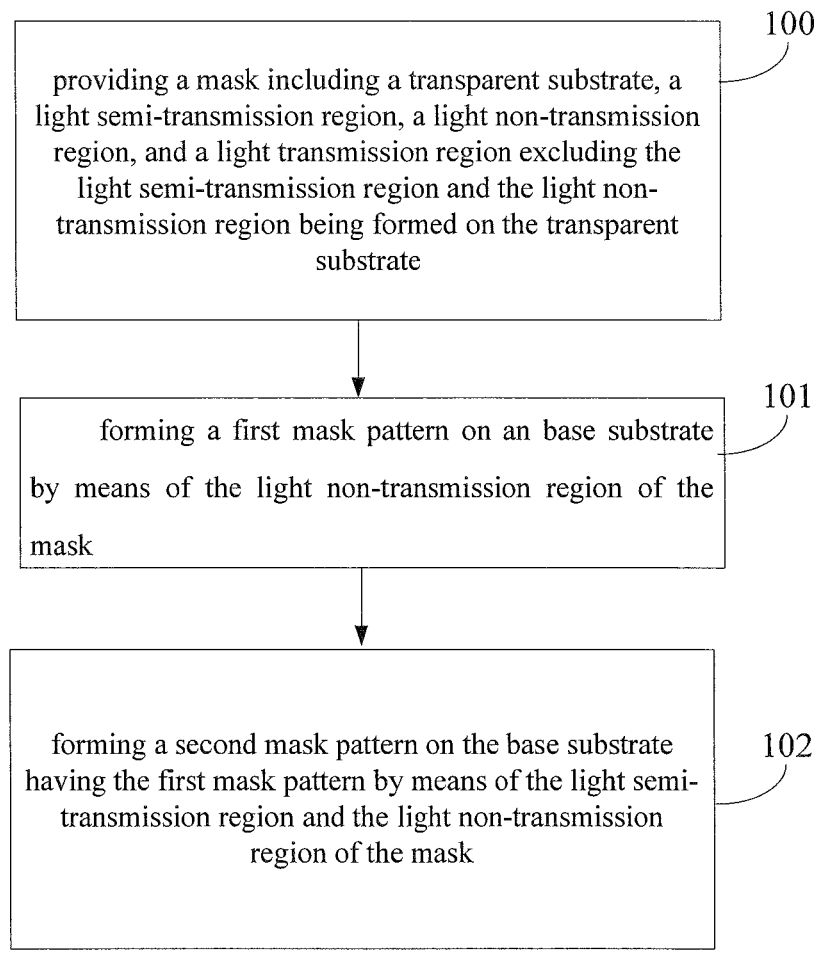
FIG. 1 is a flow chart of a method for manufacturing an array substrate according to an embodiment of the present disclosure.

The specific embodiments of the present disclosure have been shown by the above drawings and will be described in detail hereinafter. These drawings and description should not be constructed as limitation to the concept of the present disclosure in any way, but only illustration to the concept of the present disclosure for the person skilled in the art with reference to specific embodiments.

DETAILED DESCRIPTION OF PREFERRED EMBODIMENTS OF THE INVENTION

Exemplary embodiments of the present disclosure will be described hereinafter in detail with reference to the attached drawings. In addition, in the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The embodiments of the present disclosure provide a method for manufacturing an array substrate, as illustrated in FIG. 1, the method comprising:

Step 100: providing a mask including a transparent substrate, a light semi-transmission region, a light non-transmission region, and a light transmission region excluding the light semi-transmission region and the light non-transmission region being formed on the transparent substrate.

Step 101: a first mask pattern on an base substrate by means of the light non-transmission region of the mask, the mask including a transparent substrate, a light semi-transmission region, a light non-transmission region, and a light transmission region excluding the light semi-transmission region and the light non-transmission region being formed on the transparent substrate.

Step 102: a second mask pattern on the base substrate having the first mask pattern by means of the light semi-transmission region and the light non-transmission region of the mask.

In the method for manufacturing the array substrate according to the embodiments of the present disclosure, firstly, forming the first mask pattern on the base substrate by means of the light non-transmission region of the mask; and then forming a second mask pattern on the base substrate having the first mask pattern by means of the light semi-transmission region and the light non-transmission region of the same mask. Compared with the current method for manufacturing the array substrate, it simplifies the process of manufacturing the array substrate and reduces the manufacturing cost.

Figure 2:
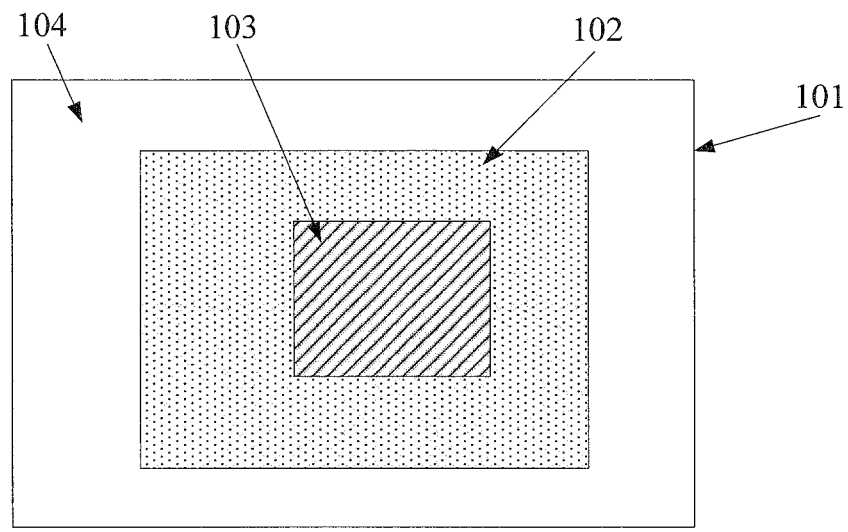
FIG. 2 is a schematic structure view of a mask according to an embodiment of the present disclosure.
Figure 3:
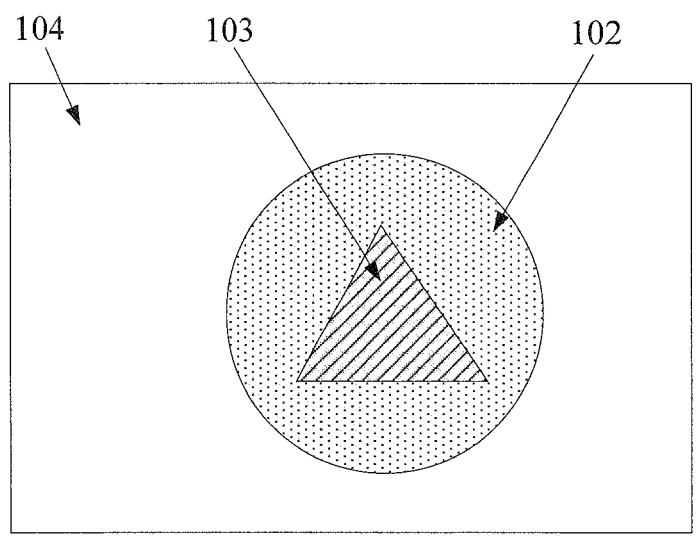
FIG. 3 is a schematic structure view of shapes of the boundary of a light non-transmission region and a light semi-transmission region of the mask according to an embodiment of the present disclosure.

As illustrated in FIG. 2, the mask 10 comprises a transparent substrate 101. A light semi-transmission region 102 is formed on the transparent substrate 101. A light non-transmission region 103 is formed on the transparent substrate 101 having the light semi-transmission region 102. A light transmission region 104 is formed in the area of the transparent substrate 101 except for the light semi-transmission region 102 and the light non-transmission region 103. The light non-transmission region 103 is located within the light semi-transmission region 102. Additionally, the shape of the light non-transmission region may be any one of a rectangle, a square, a triangle and a circle. The shape of the boundary of the light semi-transmission region may be any one of a rectangle, a square, a triangle and a circle. FIG. 3 shows a schematic view of one type of shapes of the light non-transmission region and one type of shapes of the boundary of the light semi-transmission region. In FIG. 3, the light non-transmission region 103 has a triangle shape, while the light semi-transmission region 102 has a circle-shaped boundary. In FIG. 3, the area indicated by 104 is the light transmission region.

Figure 4:
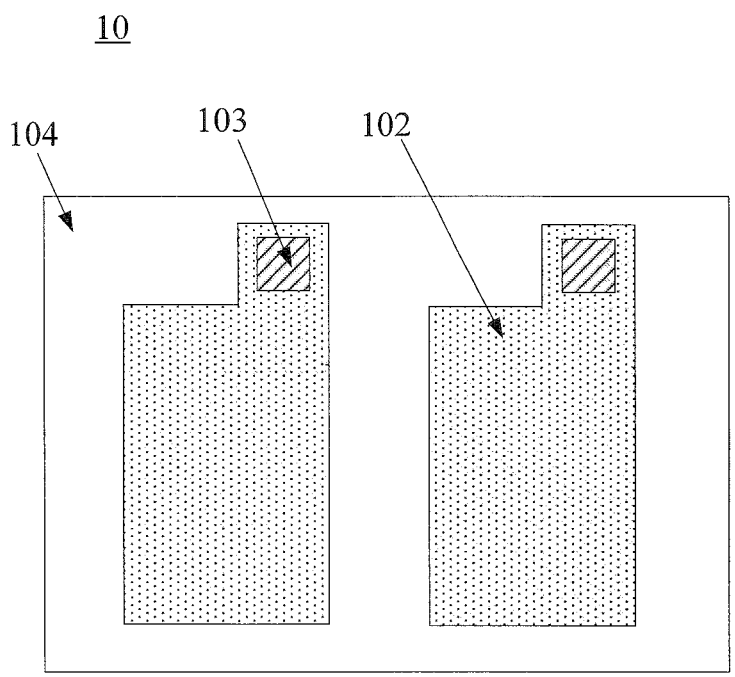
FIG. 4 is a schematic structure view of another type of the mask according to an embodiment of the present disclosure.

Exemplarily, the first mask pattern may be a via-hole pattern. The second mask pattern may be a normal layout pattern. The embodiments of the present disclosure will be described with the first mask pattern (the via-hole pattern) being a passivation layer pattern and the second mask pattern being an Indium-Tin Oxide (ITO) pattern for instance. The schematic structural view of the corresponding mask 10 forming these two mask patterns are illustrated in FIG. 4. In FIG. 4, reference numeral 102 indicates the light semi-transmission region, reference numeral 103 indicates the light non-transmission region and reference numeral 104 indicates the light transmission region 104.

Figure 5:
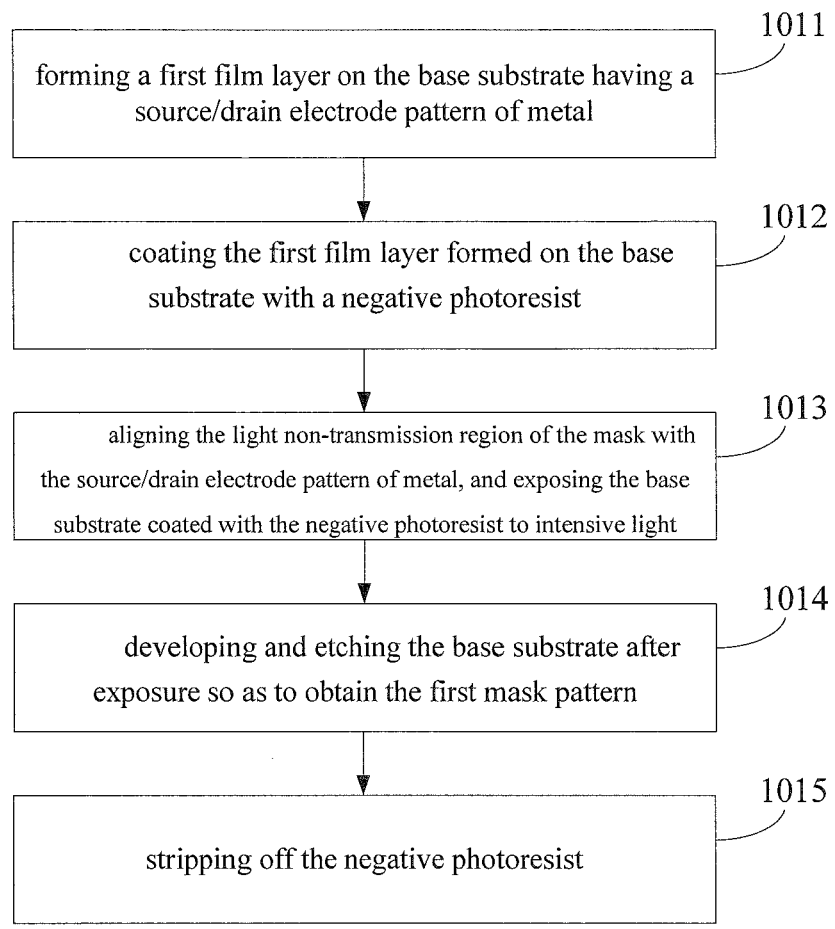
FIG. 5 is a flow chart of a method for forming a first mask pattern according to an embodiment of the present disclosure.

Step 101, as illustrated in FIG. 5, it may comprise:
Step 1011: forming a first film layer on the base substrate having a source/drain electrode pattern of metal.

Figure 6:
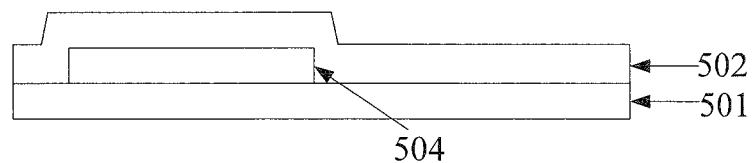
FIG. 6 is a schematic structure view of abase substrate having a first film layer according to an embodiment of the present disclosure.

Exemplarily, the first film layer may be a passivation layer film. As shown in FIG. 6, the first film layer 502, i.e. the passivation layer film, is formed on the base substrate 501 having the source/drain electrode pattern of metal 504.

Step 1012: coating the first film layer formed on the base substrate with a negative photoresist.

Figure 7:
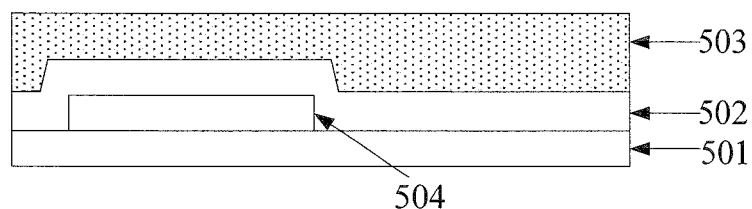
FIG. 7 is a schematic structure view of the base substrate according to an embodiment of the present disclosure, with the first film layer being coated with a negative photoresist.

As illustrated in FIG. 7, coating the first film layer 502, i.e. the passivation layer film, formed on the base substrate 501 with a negative photoresist. Reference numeral 504 in FIG. 7 indicates the source/drain electrode pattern of metal. The negative photoresist will become insoluble after being exposed and the unilluminated portion during developing process will dissolve in developing liquid.

Step 1013: aligning the light non-transmission region of the mask with the source/drain electrode pattern of metal, and exposing the base substrate coated with the negative photoresist to intensive light.

Figure 8:
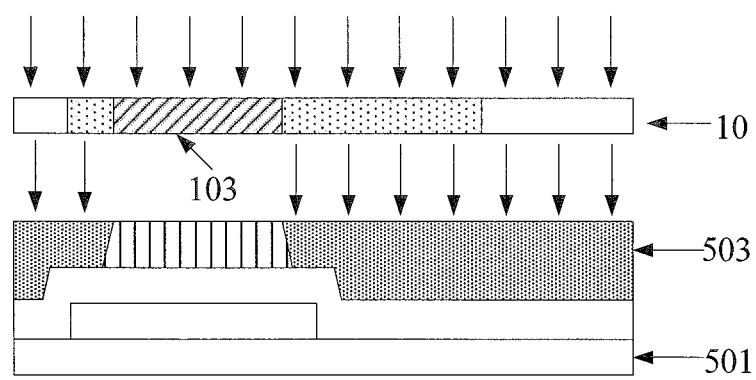
FIG. 8 is a schematic structure view of exposing the base substrate to intensive light according to an embodiment of the present disclosure.

As illustrated in FIG. 8, aligning the light non-transmission region 103 of the mask 10 with the source/drain electrode pattern of metal, and exposing the base substrate 501 coated with the negative photoresist 503 to intensive light. Light transmittance of the light semi-transmission region of the mask to the intensive light is 1. By means of the intensive light, the base substrate coated with the negative photoresist is exposed. At this time, the light non-transmission region will not allow the light to pass through it, and the negative photoresist corresponding to the light non-transmission region cannot be illuminated.

Step 1014: developing and etching the base substrate after exposure so as to obtain the first mask pattern.

Figure 9:
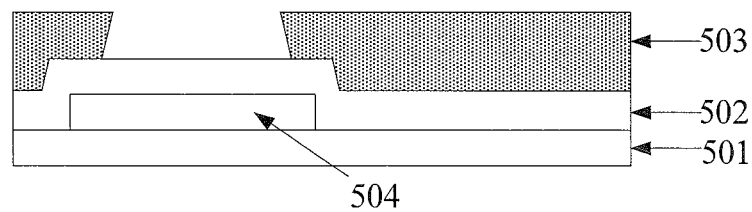
FIG. 9 is a side view of the base substrate after the negative photoresist is dissolved, according to an embodiment of the present disclosure.
Figure 10:
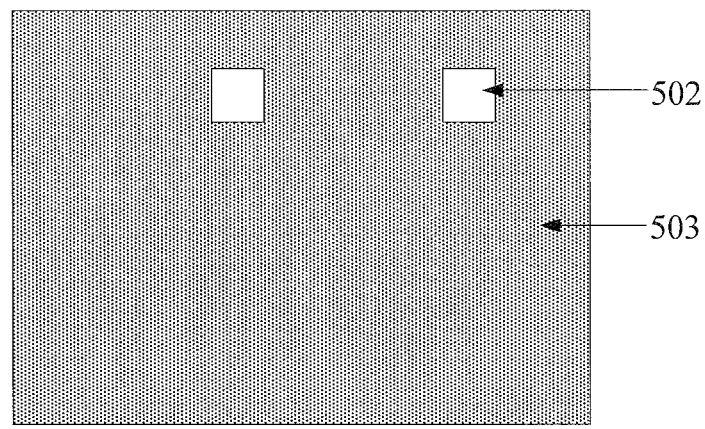
FIG. 10 is a top view of the base substrate after the negative photoresist is dissolved, according to an embodiment of the present disclosure.
Figure 11:
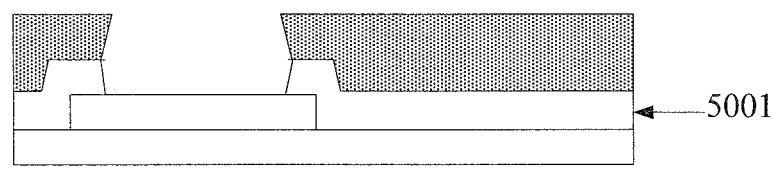
FIG. 11 is a schematic structure view of the base substrate after the first mask pattern is formed, according to an embodiment of the present disclosure.

As illustrated in FIG. 9, the negative photoresist corresponding to the light non-transmission region cannot be illuminated, and thus during the base substrate developed after exposure, the unilluminated negative photoresist will dissolve in developing liquid. FIG. 9 is a side view of the base substrate after the unilluminated negative photoresist has been dissolved, in which reference numeral 501 indicates the base substrate, reference numeral 502 indicates the passivation layer film, reference numeral 503 indicates the negative photoresist, and reference numeral 504 indicates the source/drain electrode pattern of metal. FIG. 10 is a top view corresponding to FIG. 9. In FIG. 10, reference numeral 502 indicates the passivation layer film, and reference numeral 503 indicates the negative photoresist. After being etched, the first mask pattern, i.e. the passivation layer pattern 5001, is obtained, as illustrated in FIG. 11.

Step 1015: stripping off the negative photoresist.

Figure 12:
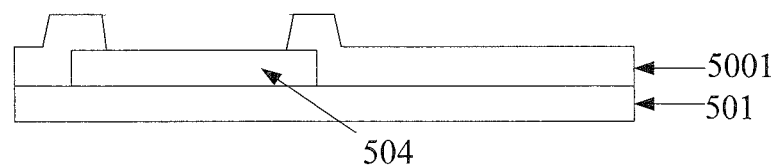
FIG. 12 is a side view of the base substrate after the negative photoresist is stripped off, according to an embodiment of the present disclosure.
Figure 13:
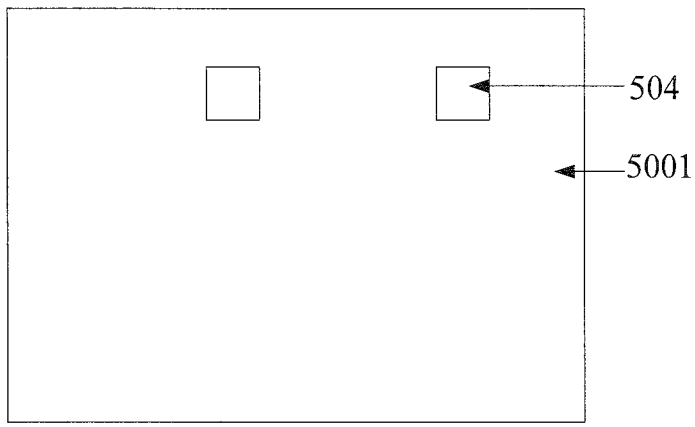
FIG. 13 is a top view of the base substrate after the negative photoresist is stripped off, according to an embodiment of the present disclosure.

The structure as illustrated in FIG. 12 is formed after the negative photoresist is stripped off. FIG. 12 is a side view of the base substrate after the negative photoresists stripped off, in which reference numeral 5001 indicates the passivation layer pattern, reference numeral 501 indicates the base substrate, and reference numeral 504 indicates the source/drain electrode pattern of metal. FIG. 13 is a top view corresponding to FIG. 12, in which reference numeral 504 indicates the source/drain electrode pattern of metal and reference numeral 5001 indicates the passivation layer pattern.

Figure 14:
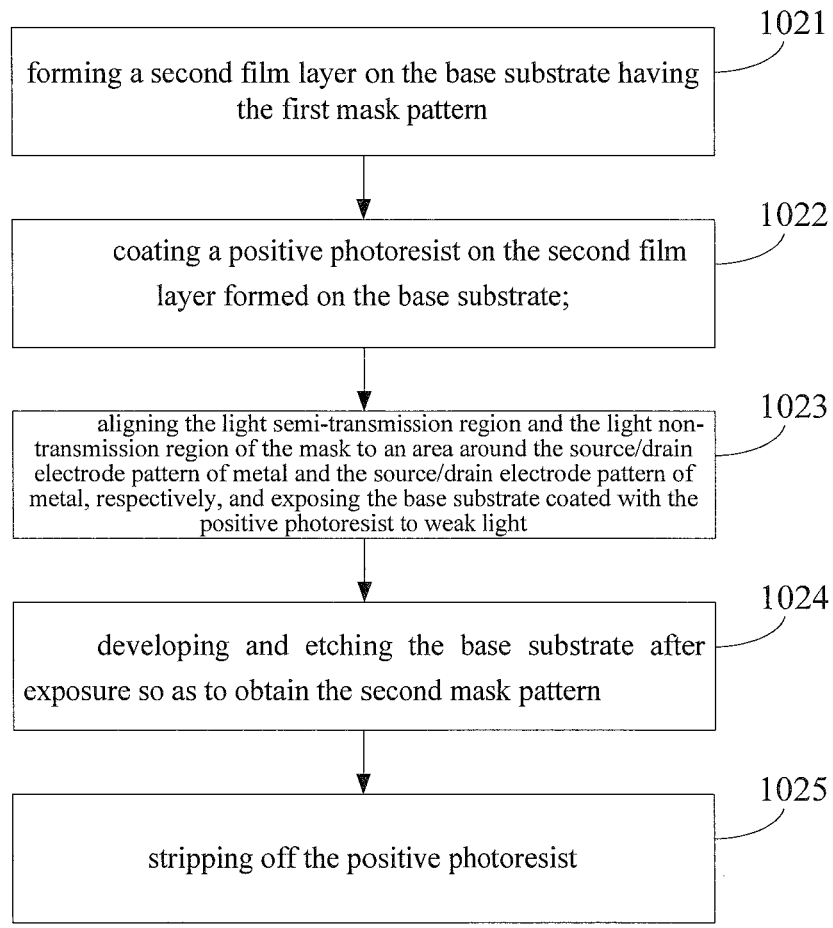
FIG. 14 is a flow chart of a method for forming a second mask pattern on the base substrate according to an embodiment of the present disclosure.

As illustrated in FIG. 14, step 102 may comprise:
Step 1021: forming a second film layer on the base substrate having the first mask pattern.

Figure 15:
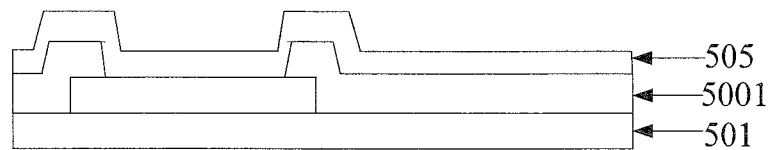
FIG. 15 is a schematic structural view of the base substrate having a second film layer, according to an embodiment of the present disclosure.

As illustrated in FIG. 15, the second film layer 505, i.e. 2ITO film, is formed on the base substrate 501 having the first mask pattern 5001, i.e. the passivation layer pattern.

Step 1022: coating a positive photoresist on the second film layer formed on the base substrate.

Figure 16:
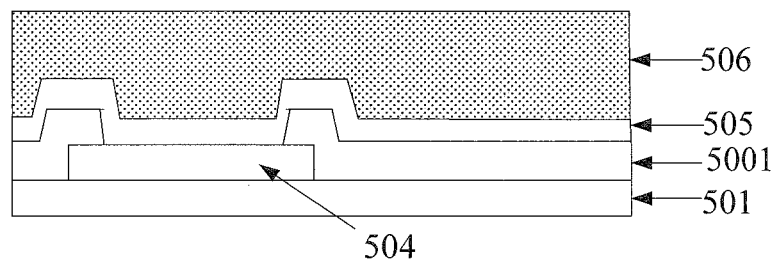
FIG. 16 is a schematic structural view of the base substrate coated with a positive photoresist, according to an embodiment of the present disclosure.

As illustrated in FIG. 16, the positive photoresist is coated on the 2ITO film 505 formed on the base substrate 501. In FIG. 16, reference numeral 504 indicates the source/drain electrode pattern of metal and reference numeral 5001 indicates the passivation layer pattern. In contrast to the negative photoresist, the positive photoresist will become soluble after being illuminated, and the illuminated portion thereof will dissolve in developing liquid during the developing process.

Step 1023: aligning the light semi-transmission region and the light non-transmission region of the mask with an area around the source/drain electrode pattern of metal and the source/drain electrode pattern of metal, respectively, and exposing the base substrate coated with the positive photoresist to weak light.

Figure 17:
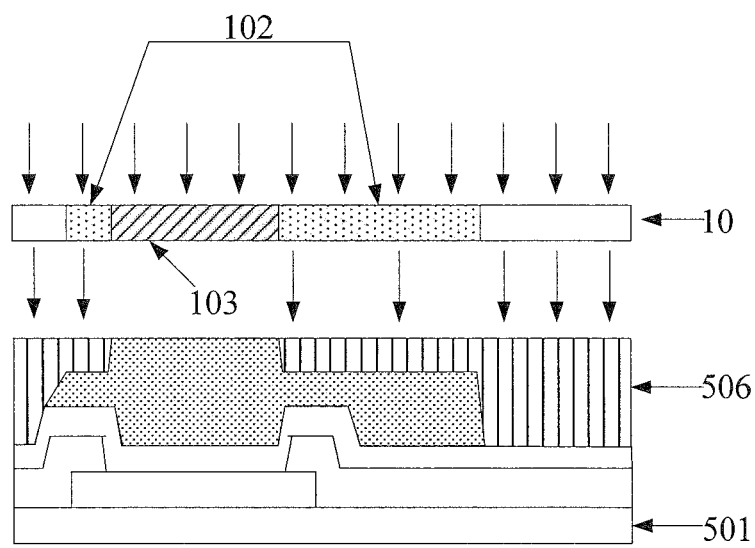
FIG. 17 is a schematic structure view of exposing the base substrate to weak light, according to an embodiment of the present disclosure.

As shown in FIG. 17, aligning the light semi-transmission region 102 and the light non-transmission region 103 of the mask 10 with an area around the source/drain electrode pattern of metal and the source/drain electrode pattern of metal, respectively, and exposing the base substrate 501 coated with the positive photoresist 506 to weak light. Light transmittance of the light semi-transmission region of the mask to the weak light is $2/5$ to $1/2$. By means of the weak light, the base substrate coated with the positive photoresist is exposed. At this time, the light non-transmission region 103 will not allow the light to pass through it, while the light semi-transmission region 102 will allow the light to partially pass through it, and thus the positive photoresist corresponding to the light non-transmission region and the light semi-transmission region will not be fully illuminated.

Step 1024: developing and etching the base substrate after exposure so as to obtain the second mask pattern.

Figure 18:
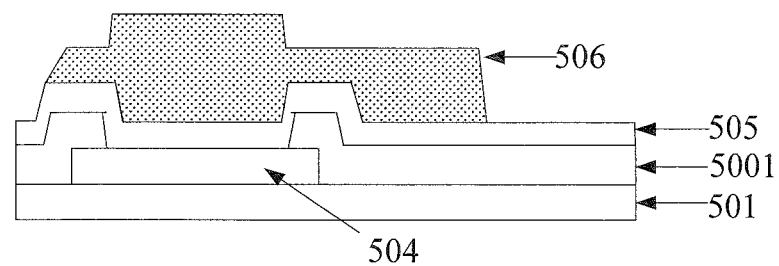
FIG. 18 is a side view of the base substrate after the positive photoresist is dissolved, according to an embodiment of the present disclosure.
Figure 19:
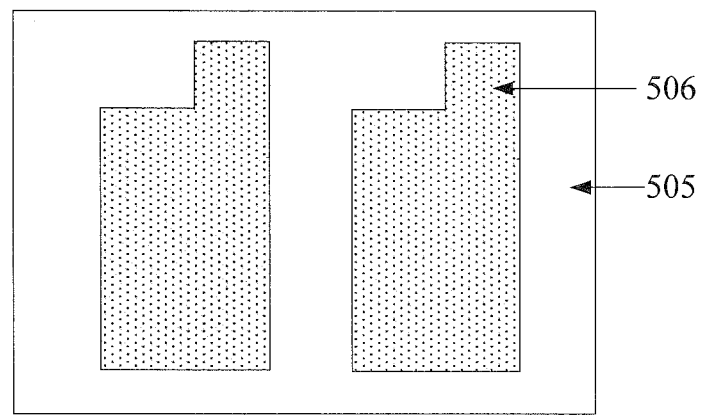
FIG. 19 is a top view of the base substrate after the positive photoresist is dissolved, according to an embodiment of the present disclosure.
Figure 20:
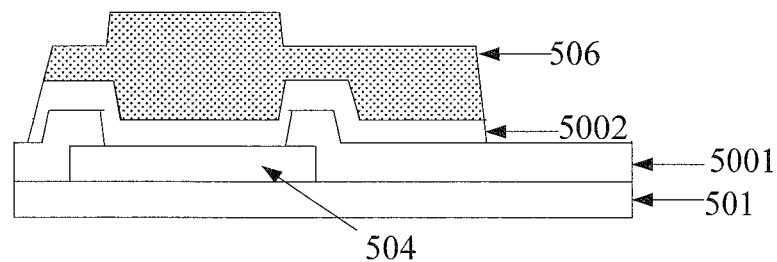
FIG. 20 is a schematic structural view of the base substrate after the second mask pattern is formed, according to an embodiment of the present disclosure.

As illustrated in FIG. 18, the positive photoresist corresponding to a 2ITO pattern cannot be fully illuminated, and thus during the exposed base substrate is developed, the positive photoresist which is not fully illuminated will be remained. FIG. 18 is a side view of the base substrate after the fully illuminated positive photoresist is dissolved, in which reference numeral 501 indicates the base substrate, reference numeral 5001 indicates the passivation layer pattern, reference numeral 505 indicates the 2ITO film, reference numeral 506 indicates the positive photoresist, and reference numeral 504 indicates the source/drain electrode pattern of metal. FIG. 19 is a top view corresponding to FIG. 18, and in FIG. 19, reference numeral 505 indicates the 2ITO film and reference numeral 506 indicates the positive photoresist. After being etched, the second mask pattern, i.e. the 2ITO pattern 5002, is obtained, as illustrated in FIG. 20, in which, reference numeral 501 indicates the base substrate, reference numeral 5001 indicates the passivation layer pattern, reference numeral 504 indicates the source/drain electrode pattern of metal, and reference numeral 506 indicates the positive photoresist.

Step 1025: stripping off the positive photoresist.

Figure 21:
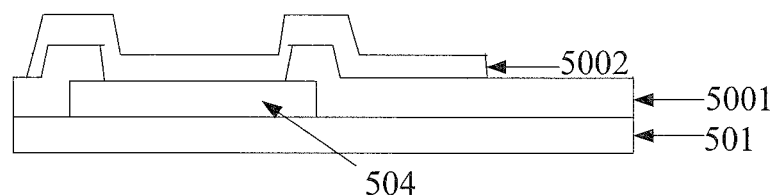
FIG. 21 is a side view of the base substrate after the positive photoresists stripped off, according to an embodiment of the present disclosure.
Figure 22:
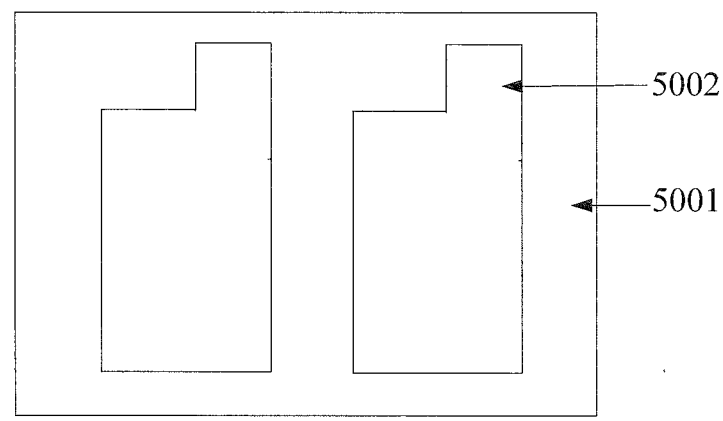
FIG. 22 is a top view of the base substrate after the positive photoresist is stripped off, according to an embodiment of the present disclosure.

The structure as illustrated in FIG. 21 is formed after the positive photoresists stripped off, in which reference numeral 501 indicates the base substrate, reference numeral 5001 indicates the passivation layer pattern, reference numeral 504 indicates the source/drain electrode pattern of metal, and reference numeral 5002 indicates the 2ITO pattern. FIG. 21 is a side view of the base substrate after the positive photoresist is stripped off, and FIG. 22 is a top view corresponding to FIG. 21, in which reference numeral 5001 indicates the passivation layer pattern, and reference numeral 5002 indicates the 2ITO pattern.

In the manufacturing process of the array of the TFT-LCD, the mask is widely used to create the patterns. However, the mask is relatively expensive, generally costs several tens of thousands dollars to several hundreds of thousands dollar, which constitutes one of main costs of the development of a new product. The embodiments of the present disclosure provides a technical for saving the masks, in which, a light semi-transmission film technology is employed to the mask, and the positive photoresist and the negative photoresist are used in manufacturing process, such that two masks are combined into a single mask. In this regard, at least one mask is saved for each type of products, and the resultant quantity of the mask and the relevant cost are both reduced. These two mask patterns in embodiments of the present disclosure are in the relationship of including and being included, wherein the first mask pattern should be smaller than the second mask pattern and be fully covered by the second mask pattern. In addition, the first mask pattern is a via-hole pattern and the second mask pattern is a normal layout pattern. These two mask patterns are formed on one same mask by means of a light semi-transmission film (the light semi-transmission material), wherein the light non-transmission region serves to form the first mask pattern, and the light semi-transmission region and the light non-transmission region serve to form the second mask pattern together. Corresponding to the design of the mask pattern, when the first mask pattern is exposed, the negative photoresist is used as the photoresist; when the second mask pattern is exposed, the positive photoresist is used as the photoresist.

In summary, the embodiments of the present disclosure provide a method for manufacturing the array substrate: firstly forming the first mask pattern on the base substrate by means of the light non-transmission region of the mask, and then forming the second mask pattern on the base substrate having the first mask pattern by means of the light semi-transmission region and the light non-transmission region of the same mask. Compared with the current method for manufacturing the array substrate, it simplifies the manufacturing process of the array substrate and reduces the manufacturing cost.

The embodiments of the present disclosure also provide an array substrate, as illustrated in FIG. 21. The array substrate is manufactured with the above-mentioned method.

Accordingly, the embodiments of the present disclosure provide a display panel comprising the array substrate illustrated in FIG. 21 which is manufactured by the above-mentioned method. Thus, the manufacturing process of the display panel is simplified and the cost for manufacturing it is reduced.

Accordingly, the embodiments of the present disclosure provide a display device comprising the above-mentioned display panel. Thus, the manufacturing process of the display panel is simplified and the cost for manufacturing it is reduced. Exemplarily, the display device may be: a laptop, a mobile phone, a digital frame, a tablet, a navigator, a TV, a display and any other product or component having the display function. As for other indispensable components of the display device, they can be readily envisaged and understood by the person skilled in the art, and the description thereof will not be mentioned again and should not be construed as limitation to the present disclosure.

The embodiments of the present disclosure provide a mask, as illustrated in FIG. 2, the mask 10 comprises the mask 10 comprises a transparent substrate 101. A light semi-transmission region 102 is formed on the transparent substrate 101. A light non-transmission region 103 is formed on the transparent substrate 101 having the light semi-transmission region 102. A light transmission region 104 is formed in the area of the transparent substrate 101 except for the light semi-transmission region 102 and the light non-transmission region 103.

The light non-transmission region 103 serves to form a first mask pattern of the array substrate, and the light semi-transmission region 102 and the light non-transmission region 103 serve to form a second mask pattern of the array substrate together.

To sum up, in the mask provided by the embodiments of the present disclosure, a light semi-transmission region, alight non-transmission region and alight transmission region are formed on a transparent substrate, and the light non-transmission region serves to form a first mask pattern of the array substrate, and the light semi-transmission region and the light non-transmission region serve to form a second mask pattern of the array substrate together. Therefore, the manufacturing process of the array substrate is simplified and the cost thereof is reduced.

Furthermore, the mask further comprises a light semi-transmission film formed on the transparent substrate, and the light semi-transmission region is formed on the light semi-transmission film.

The first mask pattern may be a via-hole pattern. The shape of the light non-transmission region may be any one of a rectangle, a square, a triangle and a circle. The shape of the boundary of the light semi-transmission region may be any one of a rectangle, a square, a triangle and a circle.

To sum up, in the mask provided by the embodiments of the present disclosure, a light semi-transmission region, alight non-transmission region and alight transmission region are formed on a transparent substrate, and the light non-transmission region serves to form a first mask pattern of the array substrate, and the light semi-transmission region and the light non-transmission region serve to form a second mask pattern of the array substrate together. Therefore, the manufacturing process of the array substrate is simplified and the cost thereof is reduced.

The above mentioned embodiments are only preferred embodiment of the present disclosure and are not intended to limit the present disclosure thereto. Any modification, equivalent, improvement and the like within the spirit and principle of the present disclosure should be incorporated in the protection scope of the present disclosure.

What is claimed is:

1. A method for manufacturing an array substrate, wherein the method comprises:
   providing a mask including a transparent substrate, a light semi-transmission region, a light non-transmission region, and a light transmission region excluding the light semi-transmission region and the light non-transmission region being formed on the transparent substrate, wherein the light semi-transmission region and the light non-transmission region have a same thickness as that of the transparent substrate and pass through the transparent substrate in a thickness direction, such that the transparent substrate has an uniform thickness as whole,
   forming a first mask pattern on a base substrate by means of the light non-transmission region of the mask only; and
   forming a second mask pattern on the base substrate having the first mask pattern by means of the light semi-transmission region and the light non-transmission region of the mask.

2. The method according to claim 1, wherein, the step of forming the first mask pattern on the base substrate by means of the light non-transmission region of the mask comprises:
   forming a first film layer on the base substrate having a source/drain electrode pattern of metal;
   coating the first film layer formed on the base substrate with a negative photoresist;
   aligning the light non-transmission region of the mask with the source/drain electrode pattern of metal, and exposing the base substrate coated with the negative photoresist to intensive light;
   developing and etching the base substrate after exposure so as to obtain the first mask pattern; and
   stripping off the negative photoresist.

3. The method according to claim 2, wherein, the step of forming a second mask pattern on the base substrate having the first mask pattern by means of the light semi-transmission region and the light non-transmission region of the mask comprises:
   forming a second film layer on the base substrate having the first mask pattern;
   coating a positive photoresist on the second film layer formed on the base substrate;
   aligning the light semi-transmission region and the light non-transmission region of the mask with an area around the source/drain electrode pattern of metal and the source/drain electrode pattern of metal, respectively, and exposing the base substrate coated with the positive photoresist to weak light;
   developing and etching the base substrate after exposure so as to obtain the second mask pattern; and
   stripping off the positive photoresist.

4. The method according to claim 1, wherein, the first mask pattern is a via-hole pattern.

5. The method according to claim 2, wherein the first film layer is a passivation layer film.

6. The method according to claim 3, wherein, the second film layer is an Indium-Tin Oxide film.

7. The method according to claim 1, wherein, the light non-transmission region is located within the light semi-transmission region.

8. The method according to claim 1, wherein, the shape of the light non-transmission region is chosen from any one of a rectangle, a square, a triangle and a circle.

9. The method according to claim 1, wherein, the shape of the boundary of the light semi-transmission region is chosen from any one of a rectangle, a square, a triangle and a circle.

10. An array substrate, wherein the array substrate is manufactured by the method according to claim 1.

11. A mask, comprising: a transparent substrate, a light semi-transmission region, a light non-transmission region formed on the light semi-transmission region, and a light transmission region excluding the light semi-transmission region and the light non-transmission region being formed on the transparent substrate, wherein the light semi-transmission region and the light non-transmission region have a same thickness as that of the transparent substrate and pass through the transparent substrate in a thickness direction, such that the transparent substrate has an uniform thickness as whole;
   wherein, only the light non-transmission region serves to form a first mask pattern of an array substrate, and the light semi-transmission region and the light non-transmission region serve to form a second mask pattern of the array substrate together.

12. The mask according to claim 11, wherein, the mask further comprises a light semi-transmission film formed on the transparent substrate, and the light semi-transmission region is formed on the light semi-transmission film.

13. The mask according to claim 11, wherein, the first mask pattern is a via-hole pattern.

14. The mask according to claim 11, wherein, the shape of the light non-transmission region is chosen from any one of a rectangle, a square, a triangle and a circle.

* * * * *